United States Patent
Mao et al.

(10) Patent No.: US 10,775,858 B2
(45) Date of Patent: Sep. 15, 2020

(54) LIQUID IMMERSION COOLING TANK

(71) Applicant: HONGFUJIN PRECISION ELECTRONICS (TIANJIN) CO., LTD., Tianjin (CN)

(72) Inventors: Tze-Chern Mao, Neihu (TW); Yen-Chun Fu, New Taipei (TW); Chih-Hung Chang, New Taipei (TW); Yao-Ting Chang, New Taipei (TW); Li-Wen Chang, New Taipei (TW); Chao-Ke Wei, New Taipei (TW)

(73) Assignee: HONGFUJIN PRECISION ELECTRONICS (TIANJIN) CO., LTD., Tianjin (CN)

( * ) Notice: Subject to any disclaimer, the term of this patent is extended or adjusted under 35 U.S.C. 154(b) by 0 days.

(21) Appl. No.: 16/296,363

(22) Filed: Mar. 8, 2019

(65) Prior Publication Data
US 2020/0257342 A1    Aug. 13, 2020

(30) Foreign Application Priority Data

Feb. 12, 2019 (CN) .......................... 2019 1 0111026

(51) Int. Cl.
| | |
|---|---|
| H05K 7/20 | (2006.01) |
| F28D 15/00 | (2006.01) |
| F28D 15/02 | (2006.01) |
| F28F 27/02 | (2006.01) |
| G01F 1/74 | (2006.01) |
| G06F 1/20 | (2006.01) |
| H01M 10/613 | (2014.01) |
| H01M 10/6568 | (2014.01) |
| F28D 1/02 | (2006.01) |

(52) U.S. Cl.
CPC ............ *G06F 1/20* (2013.01); *F28D 1/0206* (2013.01); *H01M 10/613* (2015.04); *H01M 10/6568* (2015.04); *G06F 2200/201* (2013.01)

(58) Field of Classification Search
CPC . H05K 7/20; F28D 15/00; F28D 15/02; F28F 27/02; G01F 1/74; G06F 1/20
USPC ...... 361/699, 679.31, 702; 165/11.1, 104.19, 165/281, 301
See application file for complete search history.

(56) References Cited

U.S. PATENT DOCUMENTS

| | | | | |
|---|---|---|---|---|
| 4,031,740 A | * | 6/1977 | Achermann | F25D 29/001 374/31 |
| 2002/0021555 A1 | * | 2/2002 | Hamman | H01L 23/473 361/702 |

(Continued)

*Primary Examiner* — Xiaoliang Chen
(74) *Attorney, Agent, or Firm* — ScienBiziP, P.C.

(57) ABSTRACT

A liquid immersion cooling tank includes a reservoir and a liquid flow tube. The reservoir contains an insulating coolant to immerse an electronic device. The liquid flow tube includes an adjusting member. The reservoir includes an inlet and an outlet. The inlet and the outlet are respectively arranged at opposite ends of the electronic device. The liquid flow tube is located inside the reservoir. The liquid flow tube is coupled to at least one of the inlet and the outlet. The adjusting member faces the electronic device to control an amount of inflow or outflow of the insulating coolant. When the electronic device is immersed in the reservoir for cooling, the insulating coolant flows through the electronic device. The liquid flow tube coupled to the inlet or the outlet of the reservoir uses the adjusting member to control the amount of inflow or outflow of the insulating coolant.

16 Claims, 5 Drawing Sheets

(56) References Cited

U.S. PATENT DOCUMENTS

| | | | | |
|---|---|---|---|---|
| 2012/0315069 A1* | 12/2012 | Ikeda | ............... | G03G 15/2017 399/341 |
| 2014/0216711 A1* | 8/2014 | Shelnutt | ............... | H05K 7/203 165/301 |
| 2014/0218858 A1* | 8/2014 | Shelnutt | ............ | H05K 7/20827 361/679.31 |
| 2015/0060009 A1* | 3/2015 | Shelnutt | ............ | H05K 7/20809 165/11.1 |
| 2017/0013744 A1* | 1/2017 | Shelnutt | ............ | H05K 7/20281 |

* cited by examiner

LIQUID IMMERSION COOLING TANK

FIELD

The subject matter herein generally relates to cooling devices, and more particularly to a liquid immersion cooling tank for cooling an electronic device.

BACKGROUND

Electronic devices may be cooled by immersing the electronic devices in a liquid coolant. Generally, liquid coolant closer to an outlet of the tank has a faster outflow rate than liquid coolant away from the outlet, resulting in uneven flow of the liquid coolant and poor cooling of the electronic device.

BRIEF DESCRIPTION OF THE DRAWINGS

Implementations of the present disclosure will now be described, by way of embodiments, with reference to the attached figures.

DETAILED DESCRIPTION

Figure 1:
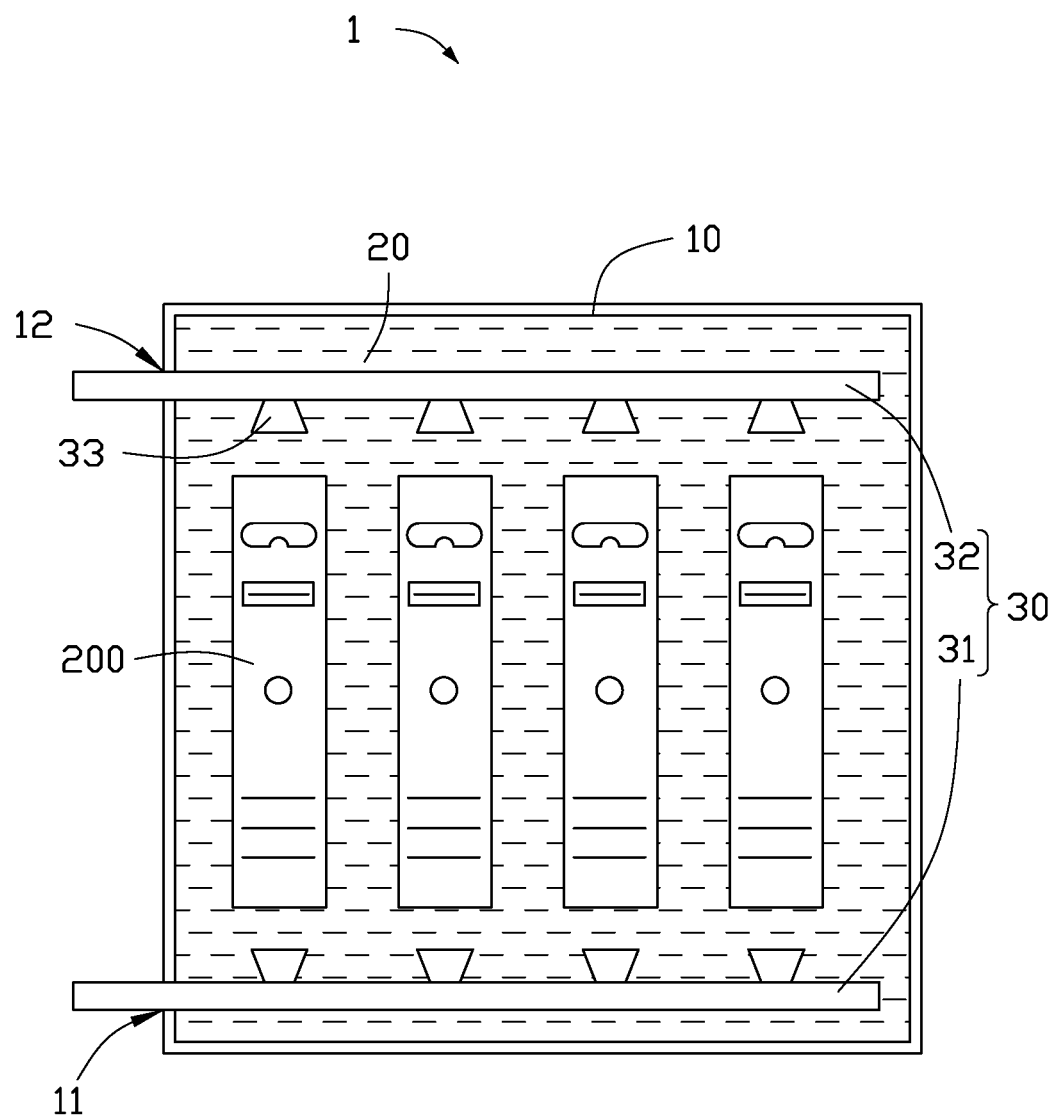
FIG. 1 is a schematic view of a first embodiment of a liquid immersion cooling tank.

It will be appreciated that for simplicity and clarity of illustration, where appropriate, reference numerals have been repeated among the different figures to indicate corresponding or analogous elements. Additionally, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

Several definitions that apply throughout this disclosure will now be presented.

The term "coupled" is defined as connected, whether directly or indirectly through intervening components, and is not necessarily limited to physical connections. The connection can be such that the objects are permanently connected or releasably connected. The term "comprising" means "including, but not necessarily limited to"; it specifically indicates open-ended inclusion or membership in a so-described combination, group, series and the like.

Figure 2:
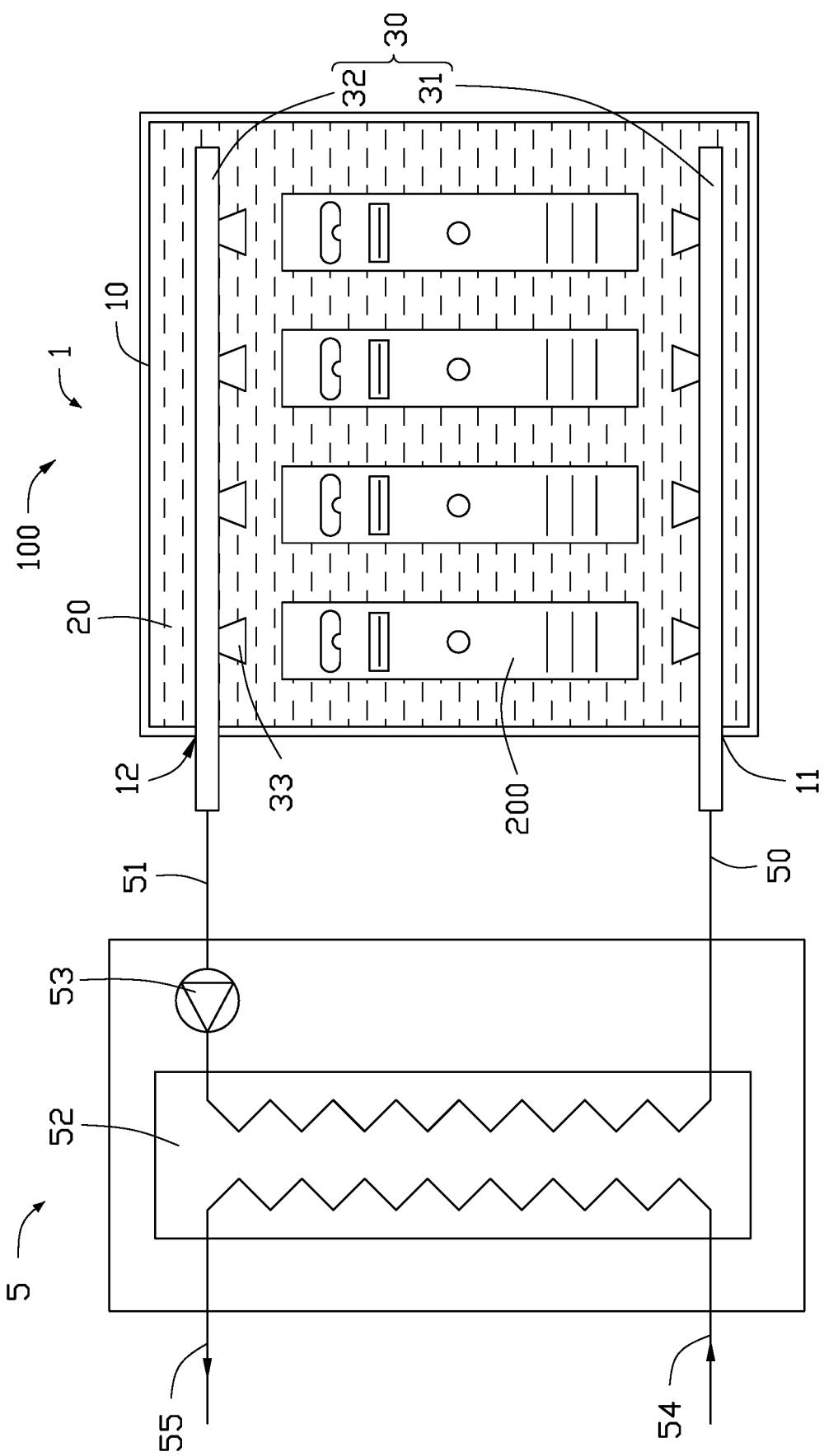
FIG. 2 is a schematic view of a cooling device including the liquid immersion cooling tank in FIG. 1.

Referring to FIG. 1 and FIG. 2, a first embodiment of a cooling device 100 for cooling an electronic device 200 includes a liquid immersion cooling tank 1 and a cold source distributor 5. The liquid immersion cooling tank 1 is coupled to the cold source distributor 5, and the liquid immersion cooling tank 1 is configured to contain an insulating coolant 20 for immersing the electronic device 200. The cold source distributor 5 provides the insulating coolant 20 to the liquid immersion cooling tank 1 and exchanges heat with the insulating coolant 20 to continuously provide the insulating coolant 20 to the liquid immersion cooling tank 1.

The liquid immersion cooling tank 1 includes a reservoir 10 and a liquid flow tube 30. The liquid flow tube 30 is disposed inside the reservoir 10 and coupled to the reservoir 10. The insulating coolant 20 flows into and flows out of the reservoir 10 through the liquid flow tube 30.

The reservoir 10 includes an inlet 11 and an outlet 12. The inlet 11 and the outlet 12 are respectively disposed at opposite ends of the electronic device 200 to input and output the insulating coolant 20. The liquid flow tube 30 includes an adjusting member 33, and one end of the liquid flow tube 30 is coupled to at least one of the inlet 11 and the outlet 12 inside the reservoir 10. The adjusting member 33 faces the electronic device 200 and is adapted for controlling an amount of inflow or outflow of the insulating coolant 20.

When the electronic device 200 is immersed in the reservoir 10 for cooling, the insulating coolant 20 flows through the electronic device 200. The liquid flow tube 30 coupled to the inlet 11 or the outlet 12 uses the adjusting member 33 to control the amount of inflow or outflow of the insulating coolant 20 to achieve uniform flow of the insulating coolant 20 in the reservoir 10 to uniformly cool the electronic device 200.

In one embodiment, the inlet 11 and the outlet 12 are respectively disposed at a lower end and an upper end of the reservoir 10. In other embodiments the inlet 11 is disposed at the upper end and the outlet 12 is disposed at the lower end. The inlet 11 and the outlet 12 may also be disposed in different positions to control inflow or outflow of the insulating coolant 20.

In one embodiment, the liquid flow tube 30 includes a first liquid flow tube 31 and a second liquid flow tube 32. One end of the first liquid flow tube 31 is coupled to the inlet 11, and one end of the second liquid flow tube 32 is coupled to the outlet 12. The first liquid flow tube 31 and the second liquid flow tube 32 are respectively disposed at opposite ends of the electronic device 200 and are parallel to each other.

Figure 3:
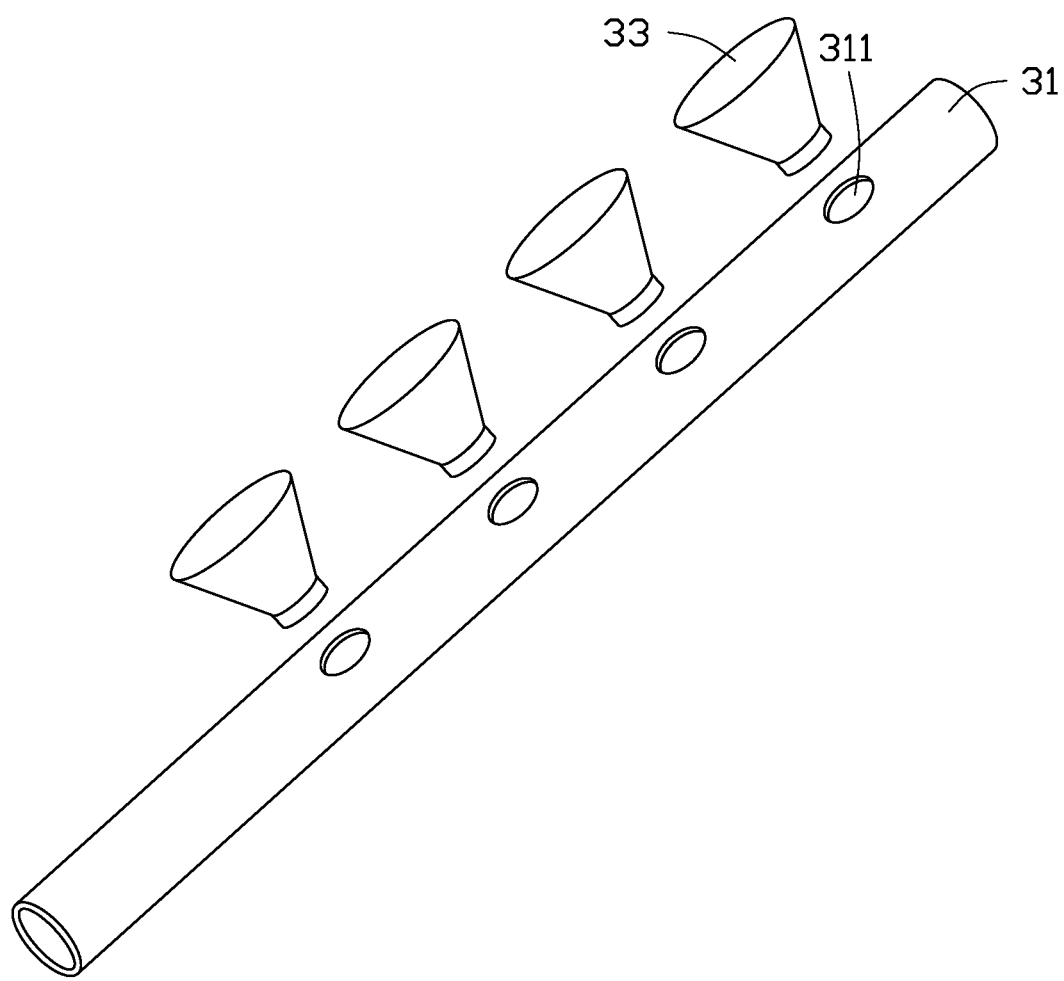
FIG. 3 is an isometric view of a first liquid flow tube shown in FIG. 1.

Referring to FIG. 1 and FIG. 3, the first liquid flow tube 31 defines a plurality of first openings 311, and the second liquid flow tube 32 defines a plurality of second openings 321. The plurality of first openings 311 and the plurality of second openings 321 are arranged in a row on the first liquid flow tube 31 and the second liquid flow tube 32, respectively.

The first liquid flow tube 31 and the second liquid flow tube 32 each include a plurality of the adjusting members 33. The plurality of adjusting members 33 are respectively disposed at the first openings 311 and the second openings 321 and are in communication with the first liquid flow tube 31 and the second liquid flow tube 32, such that the insulating coolant 20 in the first liquid flow tube 31 and the second liquid flow tube 32 can flow out or flow in from the adjusting members 33.

In one embodiment, four adjustment members 33 are disposed on each of the first liquid flow tube 31 and the second liquid flow tube 32. In other embodiments, the number of the adjusting members 33 can be changed according to the structures of the first liquid flow tube 31 and the second liquid flow tube 32. The adjusting member 33 is substantially in the shape of a truncated cone. In other embodiments, the adjusting member 33 may be other shapes.

The cold source distributor 5 is disposed at one side of the reservoir 10 and is coupled to the inlet 11 and the outlet 12. The cold source distributor 5 includes a cold source tube 50, a heat return tube 51, and a heat exchanger 52. One end of the cold source tube 50 and the heat return tube 51 are coupled to the inlet 11 and the outlet 12, respectively. The other end of the cold source tube 50 and the heat return tube 51 are coupled to the heat exchanger 52, and a pump body 53 is disposed between the heat return tube 51 and the heat exchanger 52. The cold source distributor 5 causes the insulating coolant 20 to flow out of the reservoir 10 through the pump body 53. The cold source tube 50 is configured to provide the reservoir 10 with a chilled insulating coolant 20, and the heat return tube 51 is configured to send the insulating coolant 20 to the cold source distributor 5 after the insulating coolant 20 is heated by the electronic device 200.

The cold source distributor 5 further includes a cooling port 54 and a heat return port 55. One end of the cooling port 54 and the heat return port 55 is coupled to the heat exchanger 52. The cooling port 54 is configured to provide cooling water to the heat exchanger 52, and the heat return port 55 is configured to provide heated water from the heat exchanger 52. Specifically, cooling water is sent to the heat exchanger 52 through the cooling port 54 in the cold source distributor 5, and the insulating coolant 20 is cooled and then transported to the reservoir 10 through the cold source tube 50. After the cooled insulating coolant 20 absorbs heat from the electronic device 200, the heated insulating coolant 20 is discharged from the heat return tube 51 to the heat exchanger 52 through the pump body 53. After the heated insulating coolant 20 exchanges heat with the cooling water supplied from the cooling port 54, the insulating coolant 20 is sent to the reservoir 10 through the cold source tube 50. The cooling water after absorbing heat from the heated insulating coolant is discharged from the cold source distributor 5 through the heat return port 55. The heated water output from the cold source distributor 5 can continue to be used without causing contamination of the water.

Referring to FIG. 1, FIG. 2 and FIG. 3, when a plurality of electronic devices 200 are placed in the reservoir 10 to be cooled, the cold source distributor 5 provides cooled insulating coolant 20 to the liquid immersion cooling tank 1. Insulating coolant 20 flows through the first liquid flow tube 31 coupled to the inlet 11 and flows into the reservoir 10 from the adjusting member 33. The amount of insulating coolant 20 is uniform around the electronic devices 200, and the heat generated by the electronic devices 200 is absorbed by the insulating coolant 20.

The pump body 53 of the cold source distributor 5 drives the heat return tube 51. Heated insulating coolant 20 is sucked through the adjusting members 33 into the second liquid flow tube 32 and then output to the heat exchanger 52. In the heat exchanger 52, after heat-transfer of the insulating coolant 20 with the cooling water, the insulating coolant 20 continues to flow into the reservoir 10, and the heated cooling water passes through the heat return port 55 and flows out of the cold source distributor 5. The electronic device 200 is cooled by the circulating insulating coolant 20 flowing between the cold source distributor 5 and the liquid immersion cooling tank 1.

In one embodiment, the electronic device 200 is a server. It can be understood that the electronic device 200 can also be other devices capable of generating heat.

Second Embodiment

Figure 4:
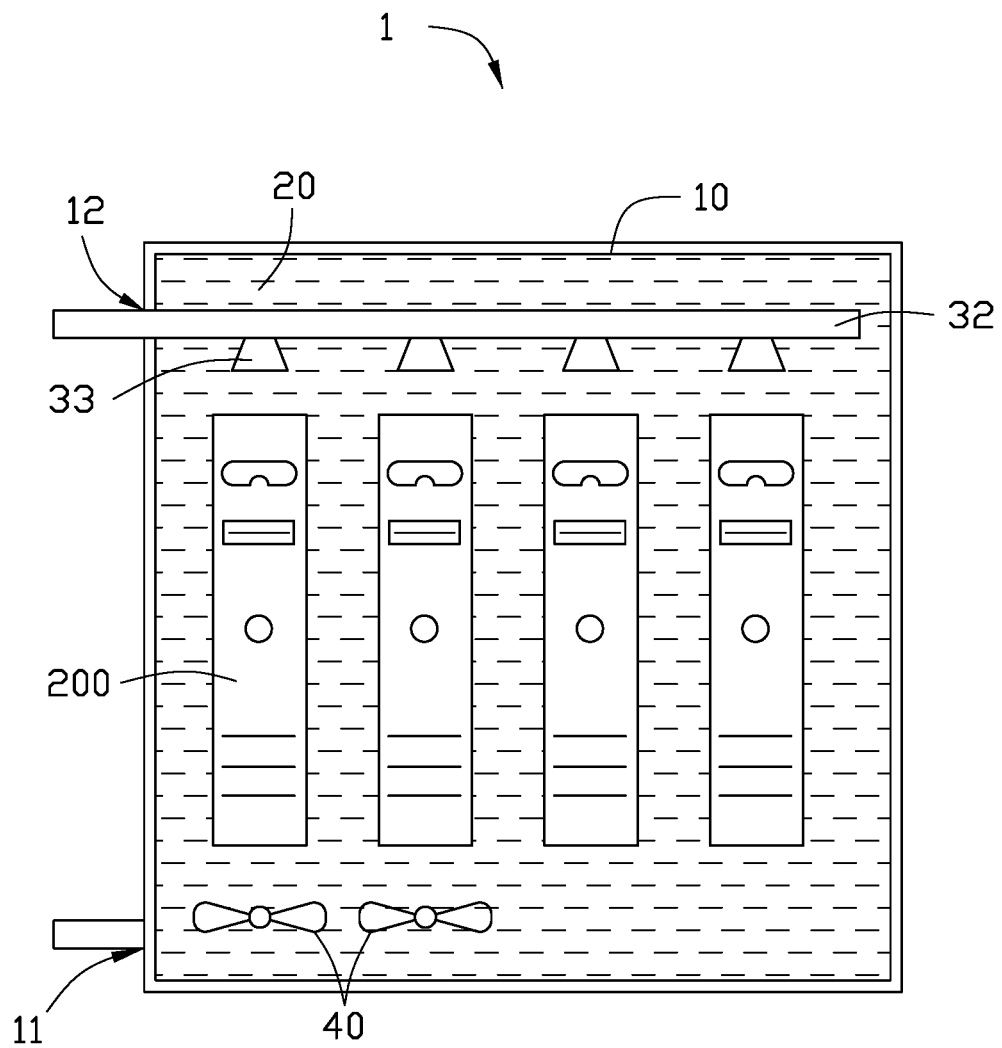
FIG. 4 is a schematic diagram of a second embodiment of a liquid immersion cooling tank.
Figure 5:
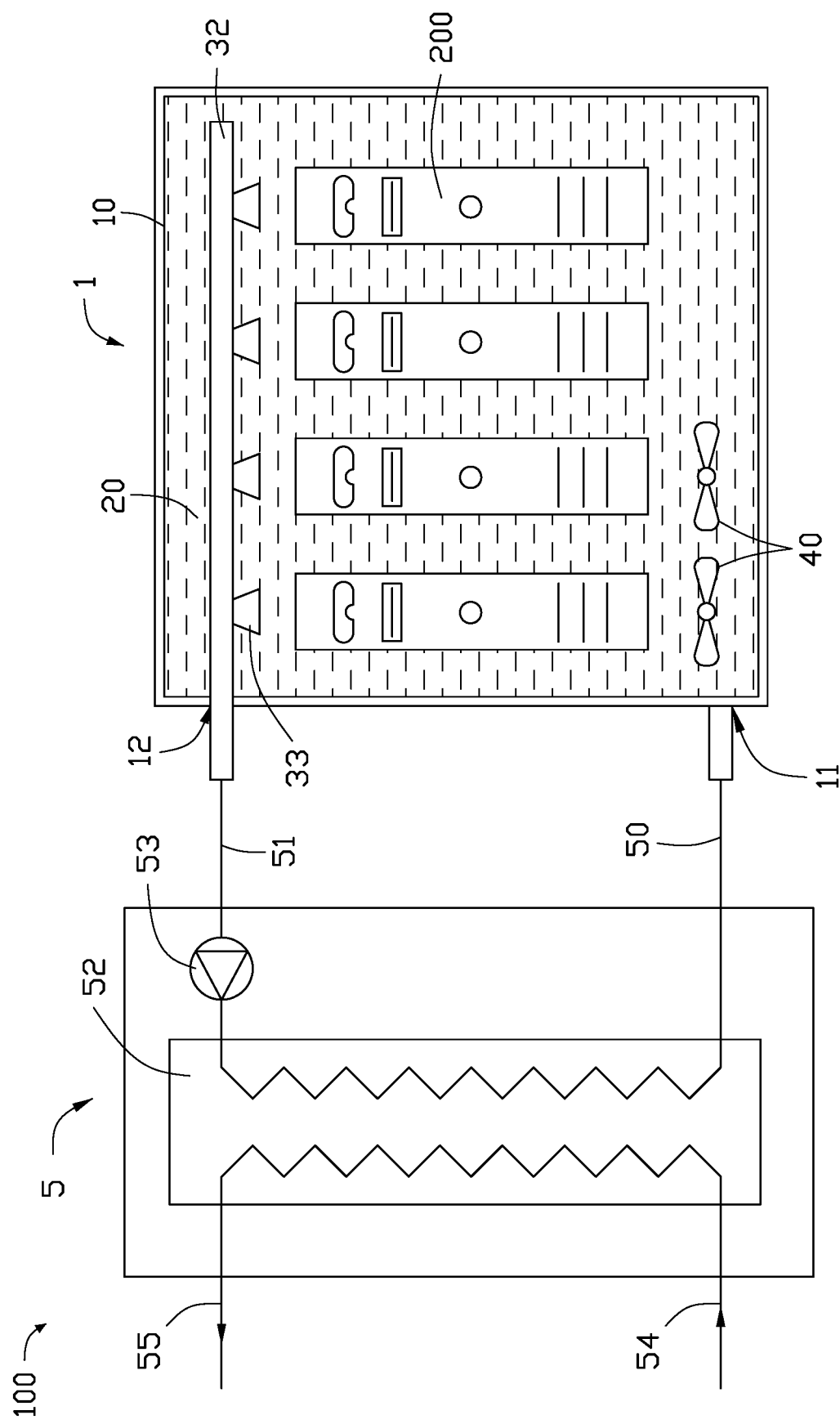
FIG. 5 is a schematic view of a cooling device including the liquid immersion cooling tank in FIG. 4.

Referring to FIG. 3, FIG. 4, and FIG. 5, in a second embodiment, the first liquid flow tube 31 is omitted. A driving member 40 for driving the insulating coolant 20 to flow is disposed at one end of the electronic device 200 adjacent to the inlet 11. The driving member 40 and the second liquid flow tube 32 are respectively disposed at opposite ends of the electronic device 200.

A driving direction of the driving member 40 is the same as a flowing direction of the insulating coolant 20. The driving member 40 may be a blade, but in other embodiments, the driving member 40 may be other structures capable of driving the insulating coolant 20 to flow in the reservoir 10. It can be understood that the insulating coolant 20 closer to the inlet 11 is driven to flow faster by the driving member 40 than the insulating coolant 20 further away from the inlet 11, resulting in an upward flowing direction of the insulating coolant 20. Therefore, the driving member 40 can be disposed at the inlet 11 adjacent to one end of the electronic device 200 to facilitate the insulating coolant 20 flowing through the electronic device 200.

The insulating coolant 20 driven by the driving member 40 carries away heat generated by the electronic device 200, and then flows out of the reservoir 10 through the second liquid flow tube 32.

The liquid immersion cooling tank 1 and the cooling device 100 including the liquid flow tube 30 or the driving member 40 can uniformly cool the electronic device 200, regardless of whether the electronic device 200 is adjacent to or further away from the inlet 11 or the outlet 12.

The embodiments shown and described above are only examples. Even though numerous characteristics and advantages of the present technology have been set forth in the foregoing description, together with details of the structure and function of the present disclosure, the disclosure is illustrative only, and changes may be made in the detail, including in matters of shape, size and arrangement of the parts within the principles of the present disclosure up to, and including, the full extent established by the broad general meaning of the terms used in the claims.

What is claimed is:

1. A liquid immersion cooling tank comprising:
 a reservoir configured to contain insulating coolant to immerse an electronic device;
 a liquid flow tube comprising an adjusting member; wherein:
 the reservoir defines an inlet and an outlet;
 the inlet and the outlet are respectively arranged at opposite sides of the electronic device;
 the insulating coolant flows into the reservoir through the inlet and flows out of the reservoir through the outlet;
 the liquid flow tube is inside the reservoir;
 the liquid flow tube is coupled to at least one of the inlet and the outlet;
 the adjusting member faces the electronic device and is adapted for controlling an amount of inflow or outflow of the insulating coolant;
 when the electronic device is immersed in the reservoir for cooling, the insulating coolant cools the electronic device.

2. The liquid immersion cooling tank of claim 1, wherein:
 the liquid flow tube comprises a first liquid flow tube and a second liquid flow tube;
 the first liquid flow tube is coupled to the inlet;
 the second liquid flow tube is coupled to the outlet;
 the first liquid flow tube and the second liquid flow tube are arranged on opposite sides of the electronic device and are parallel to each other;

after the insulating coolant flows into the reservoir through the first liquid flow tube, the insulating coolant flows through the electronic device;

after the insulating coolant flows through the electronic device, the insulating coolant flows out of the reservoir through the second liquid flow tube.

3. The liquid immersion cooling tank of claim 1, wherein:
the liquid flow tube is coupled to the outlet;
the reservoir comprises a driving member configured to drive the insulating coolant to flow;
the liquid flow tube and the driving member are respectively arranged on opposite sides of the electronic device;
the insulating coolant flows into the reservoir, and is driven by the driving member toward one end of the liquid flow tube; and
the insulating coolant flows out of the reservoir through the liquid flow tube.

4. The liquid immersion cooling tank of claim 3, wherein:
the driving member is arranged adjacent to the inlet; and
a driving direction of the driving member is the same as a flowing direction of the insulating coolant.

5. The liquid immersion cooling tank of claim 3, wherein:
the driving member comprises a blade.

6. The liquid immersion cooling tank of claim 1, wherein:
a side of the liquid flow tube facing the electronic device when the electronic device is immersed in the reservoir defines at least one opening;
the adjusting member is mounted in the at least one opening and is coupled to the liquid flow tube.

7. The liquid immersion cooling tank of claim 6, wherein:
the plurality of openings are arranged in a row.

8. A cooling device comprising a cold source distributor and a liquid immersion cooling tank coupled to the cold source distributor, the liquid immersion cooling tank comprising:
a reservoir configured to contain insulating coolant to immerse an electronic device;
a liquid flow tube comprising an adjusting member; wherein:
the reservoir defines an inlet and an outlet;
the inlet and the outlet are respectively arranged at opposite sides of the electronic device;
the insulating coolant flows into the reservoir through the inlet and flows out of the reservoir through the outlet;
the liquid flow tube is inside the reservoir;
the liquid flow tube is coupled to at least one of the inlet and the outlet;
the adjusting member faces the electronic device and is adapted for controlling an amount of inflow or outflow of the insulating coolant;
when the electronic device is immersed in the reservoir for cooling, the insulating coolant cools the electronic device.

9. The cooling device of claim 8, wherein:
the cold source distributor comprises a heat exchanger coupled to the inlet and the outlet.

10. The cooling device of claim 9, wherein:
the heat exchanger is coupled to a cooling nozzle and a heat return port;
the cooling nozzle provides the heat exchanger with coolant;
heat generated by the heat exchanger flows out of the heat return port.

11. The cooling device of claim 10, wherein:
the liquid flow tube comprises a first liquid flow tube and a second liquid flow tube;
the first liquid flow tube is coupled to the inlet;
the second liquid flow tube is coupled to the outlet;
the first liquid flow tube and the second liquid flow tube are arranged on opposite sides of the electronic device and are parallel to each other;
after the insulating coolant flows into the reservoir through the first liquid flow tube, the insulating coolant flows through the electronic device;
after the insulating coolant flows through the electronic device, the insulating coolant flows out of the reservoir through the second liquid flow tube.

12. The cooling device of claim 10, wherein:
the liquid flow tube is coupled to the outlet;
the reservoir comprises a driving member configured to drive the insulating coolant to flow;
the liquid flow tube and the driving member are respectively arranged on opposite sides of the electronic device;
the insulating coolant flows into the reservoir, and is driven by the driving member toward one end of the liquid flow tube; and
the insulating coolant flows out of the reservoir through the liquid flow tube.

13. The cooling device of claim 12, wherein:
the driving member is arranged adjacent to the inlet; and
a driving direction of the driving member is the same as a flowing direction of the insulating coolant.

14. The cooling device of claim 12, wherein:
the driving member comprises a blade.

15. The cooling device of claim 10, wherein:
a side of the liquid flow tube facing the electronic device when the electronic device is immersed in the reservoir defines at least one opening;
the adjusting member is mounted in the at least one opening and is coupled to the liquid flow tube.

16. The cooling device of claim 15, wherein:
the plurality of openings are arranged in a row.

* * * * *